(12) United States Patent
Wu

(10) Patent No.: US 6,232,648 B1
(45) Date of Patent: *May 15, 2001

(54) EXTENDED SELF-ALIGNED CROWN-SHAPED RUGGED CAPACITOR FOR HIGH DENSITY DRAM CELLS

(76) Inventor: Shye-Lin Wu, No. 6, Creation Rd. 2, Science-Based Industrial Park, Hsinchu (TW)

( * ) Notice: Subject to any disclaimer, the term of this patent is extended or adjusted under 35 U.S.C. 154(b) by 0 days.

This patent is subject to a terminal disclaimer.

(21) Appl. No.: 09/353,509

(22) Filed: Jul. 14, 1999

Related U.S. Application Data

(63) Continuation-in-part of application No. 09/123,748, filed on Jul. 27, 1998, now Pat. No. 6,063,683.

(51) Int. Cl.[7] ................................ H01L 21/8242
(52) U.S. Cl. ..................... 257/534; 257/308; 257/309
(58) Field of Search ..................... 438/398, 255, 438/396, FOR 212, FOR 220; 257/308, 309, 534; 148/DIG. 33.3, DIG. 14

(56) References Cited

U.S. PATENT DOCUMENTS 6,011,286 * 1/2000 WU .
6,091,098 * 7/2000 Wu .

* cited by examiner

*Primary Examiner*—George Fourson
*Assistant Examiner*—Michelle Estrada

(57) ABSTRACT

The present invention disclosed a structure of a self-aligned crown-shaped rugged capacitor for high density DRAM (dynamic random access memory) cells. The crown-shaped rugged capacitor for high density DRAM cells can be formed without the prior art crack issue. One of the advantages of the structure and a method provided in the invention is that the storage cell can be formed with reduced processing steps. A capacitor cell structure of the present invention includes a first electrode of a first conductive material, a dielectric film, and a second electrode of a second conductive material. The first electrode has a rugged surface on regions uncovered by an underlying dielectric layer, and the first electrode includes a base contact portion, first laterally extended edges, first vertically extended regions, second laterally extended edges, and second vertically extended regions. The dielectric film is formed over the first electrode and the second electrode is formed over the dielectric film.

19 Claims, 6 Drawing Sheets

US 6,232,648 B1

EXTENDED SELF-ALIGNED CROWN-SHAPED RUGGED CAPACITOR FOR HIGH DENSITY DRAM CELLS

CROSS REFERENCE TO RELATED APPLICATIONS

This invention is a continuation-in-part application of an application filed under the title of "METHOD OF FABRICATING A SELF-ALIGNED CROWN-SHAPED CAPACITOR FOR HIGH DENSITY DRAM CELLS" with the Ser. No. 09/123,748 filed at Jul. 27, 1998, now U.S. Pat. No. 6,063,683 which is assigned to same assignee with the same inventor as the present application.

FIELD OF THE INVENTION

The present invention relates to a semiconductor device structure, and more specifically, to a structure of a extended self-aligned crown-shaped rugged capacitor for high density DRAM (dynamic random access memory) cells.

BACKGROUND OF THE INVENTION

In the electric industry, memory devices are of vital application in various kinds of computer, communication, and consumer electronic products. In the electric equipment, memory devices are employed for the storage and exchange of operating data and information. The information can be stored temporarily or permanently in various kinds of memory devices, depending on the system design and needs. The DRAM is one of the most important memory devices for providing temporary data storage in numerous system applications. In the last decade, the DRAM is the flagship product of the semiconductor industry for its high-density structure and wide applications.

In general, a DRAM cell is composed of a transistor and a capacitor. A MOSFET (metal oxide semiconductor field effect transistor) is utilized preferably to enable the writing and the reading of the data. The capacitor is employed to store electric charge, wherein the data is represent by the voltage level of the electric charge. The DRAM cells can be accessed with unlimited reading and writing cycles with high frequency and reliability.

For reducing the cost and increasing the competitive power of the DRAM devices, the density of DRAM cells on unit chip area must be raised continuously. The number of DRAM cells on each chip has increased from 16M to 64M and it is believed that the 256M and higher volume DRAM chips will become the most competitive products before the end of the twentieth century. With the fast increasing density, the area occupied by each DRAM cell with a transistor and a capacitor has to narrow down several times while providing the same function and operation on data storage and exchange.

However, since the storage capacity of a capacitor is proportional to the surface area of the electrode, the capacitor structure of the traditional plate electrode must be improved. The capacitor structure must be redesigned to provide raised storage capacity or the capacitance under per unit chip area. In prior art designs, various type of stacked-capacitor structure had been proposed. As an example, M. Sakao et al. proposed a capacitor-over-bit-line (COB) cell structure in their work "A Capacitor-Over-Bit-Line (COB) Cell with a Hemispherical-Grain Storage Node for 64 Mb DRAMs" (in IEDM Tech. Dig., p. 655, 1990).

In the work of M. Sakao et al., it is disclosed that three-dimensional memory cells, such as stacked or trench capacitor cells, are necessary for future DRAMs in order to obtain sufficient storage capacitance in a small area. Several stacked capacitor cells have been proposed for 64 Mb DRAMs, because, as compared to trench capacitor cells, their fabrication procedure is relatively simple and they offer higher immunity to soft error. In the stacked capacitor cell, large capacitance can be obtained by increasing storage node height, but this causes difficulties with optical delineation and patterning. Three dimensionally arranged storage node structures have been proposed. However, their attempts cause difficulties of fabrication procedure.

H. Wantanabe et al. disclosed a new cylindrical capacitor structure in their work "A New Cylindrical Capacitor Using Hemispherical Grained Si (HSG-Si) for 256 Mb DRAMs" (in IEDM Tech. Dig., p. 259, 1992). A new selective etching technique using a low-pressure vapor hydrogen fluoride is developed to form the cylindrical capacitor electrode. A high selective etching (2000 times) of borophospho-silicate-glass to $SiO_2$ is realized with the technique. Disilane molecule irradiation in ultra-high vacuum chamber achieves the HSG-Si formation on the whole surface of phosphorous doped amorphous Si cylindrical electrode.

However, conventional stacked-capacitor structures have some unsolved strength problem in the fabrication of three-dimensional electrodes. In general, most of the three dimensional electrode structure are composed of several silicon layer which are deposited and defined separately. The three-dimensional structures with interfaces of several deposition processes on a single node are found to suffer from defect issues like cracks. The problem greatly damages the yield of the process. In addition, for developing future high density DRAMs, the conventional stacked-capacitor structure can not get sufficient capacitance. What is needed in the field is an improved design of a capacitor cell structure with raised storage capacitance without strength problem like crack issue during manufacturing processes.

SUMMARY OF THE INVENTION

The present invention disclosed a structure of an extended crown-shaped rugged capacitor for high density DRAM (dynamic random access memory) cells. The bottom electrode of the extended crown-shaped rugged capacitor has a base structure formed by a self-aligned process, The extended crown-shaped rugged capacitor for high density DRAM cells can be formed without the prior art crack issue. One of the advantages of the structure and a method provided in the invention is that the storage cell can be formed with reduced processing steps by the self-aligned approach in the present invention. The self-aligned process in forming capacitor contact opening can be integrated into the semiconductor process of forming high-density DRAM cells. The capacitor structure having extended upper crown regions formed by the proposed method can provide improved capacitance than conventional stacked-capacitor structure. The number of masks used can also be reduced with the self-aligned process in providing the base structure of the capacitor node with improved strength and reliability.

A capacitor cell structure of the present invention includes a first electrode of a first conductive material, a dielectric film, and a second electrode of a second conductive material. In the preferred embodiments, the first electrode has a rugged surface on regions uncovered by an underlying dielectric layer. The dielectric film is formed over the first electrode and the second electrode is formed over the dielectric film.

The first electrode, which is preferably composed of conductive materials like silicon, includes a base contact portion, first laterally extended edges, first vertically extended regions, second laterally extended edges, and second vertically extended regions. The base contact portion is extended down to a junction region of the substrate, such as a source or a drain junction. The first laterally extended edges are communicated to the base contact portion to provide electrical couplings essential for the operation of the electrode from the junction region of the substrate. The first vertically extended regions are extended from portions of the first laterally extended edges. The second laterally extended edges are extended from top ends of the first vertically extended regions. The second vertically extended regions, which are composed of silicon sidewalls, are extended from external ends of the second laterally extended edges.

In the case, the base contact portion, the first laterally extended edges, the first vertically extended regions, and the second laterally extended edges of the first electrode are mainly made of a single silicon layer, namely the second silicon layer as illustrated in the following method. The second silicon layer in the present invention is preferably deposited with a single chemical vapor deposition process, and thus an improved strength can be provided with a main structure of the electrode having no silicon layer interfaces.

The method of the present invention for forming a capacitor on a semiconductor substrate includes the following steps. At first, a first oxide layer is formed over the substrate and a nitride layer is then formed over the oxide layer. A second oxide layer is formed over the nitride layer and a first silicon layer is formed over the second oxide layer. Next, a node opening is defined in the first silicon layer, the second oxide layer, and the nitride layer, upon the first oxide layer. Sidewall structures are then formed on sidewalls of the node opening.

A contact opening is then defined in the first oxide layer under the node opening. The contact opening is defined in the first oxide layer under a region uncovered by the sidewall structures. The sidewall structures and a portion of the nitride layer nearby the node opening are removed to form undercut structures under the second oxide layer. A second silicon layer is then formed conformably over the contact opening, the undercut structures, the node opening, and the first silicon layer. A node-top defining layer is formed on the second silicon layer and is patterned to leave a node-top defining region. Next, a portion of the second silicon layer and a portion of the first silicon layer uncovered by the node-top defining region are removed. Silicon sidewalls are formed on sidewalls of the node-top defining region, and are communicated to the first silicon layer and the second silicon layer to form an electrode. The node-top defining region, the second oxide layer, and the nitride layer are removed. In the case, a wet etch is performed to remove the nitride layer and to roughen the surface of the electrode. A dielectric film is then formed conformably over the electrode. Finally, a conductive layer is formed over the dielectric layer.

In the illustrative examples of the present invention, a wet etch process is employed and preferably applied to roughen the surface of the electrode. In the preferred embodiments, the wet etch is carried out with a hot phosphoric solution to remove the remained silicon nitride layer, and also to remove part of the surface portion of the electrode of silicon material, in order to roughen the surface of the electrode for having a rugged surface. Therefore, a greatly raised capacitance is provided by the rugged structure of the bottom electrode.

BRIEF DESCRIPTION OF THE DRAWINGS

The foregoing aspects and many of the attendant advantages of this invention will become more readily appreciated and better understood by referencing the following detailed description, when taken in conjunction with the accompanying drawings, wherein.

DETAILED OF THE PREFERRED EMBODIMENT

A structure of an extended crown-shaped rugged capacitor is disclosed in the present invention. The self-aligned process in forming capacitor contact opening is also illustrated. The process can be integrated into the semiconductor process of forming high-density DRAM cells. The capacitor structure formed by the proposed method can provide improved capacitance than conventional stacked-capacitor structure. The capacitor structure having extended upper crown regions formed by the proposed method can provide improved capacitance than conventional stacked-capacitor structure. The number of masks used can also be reduced with the self-aligned process in providing the base structure of the capacitor node with improved strength and reliability.

Figure 1:
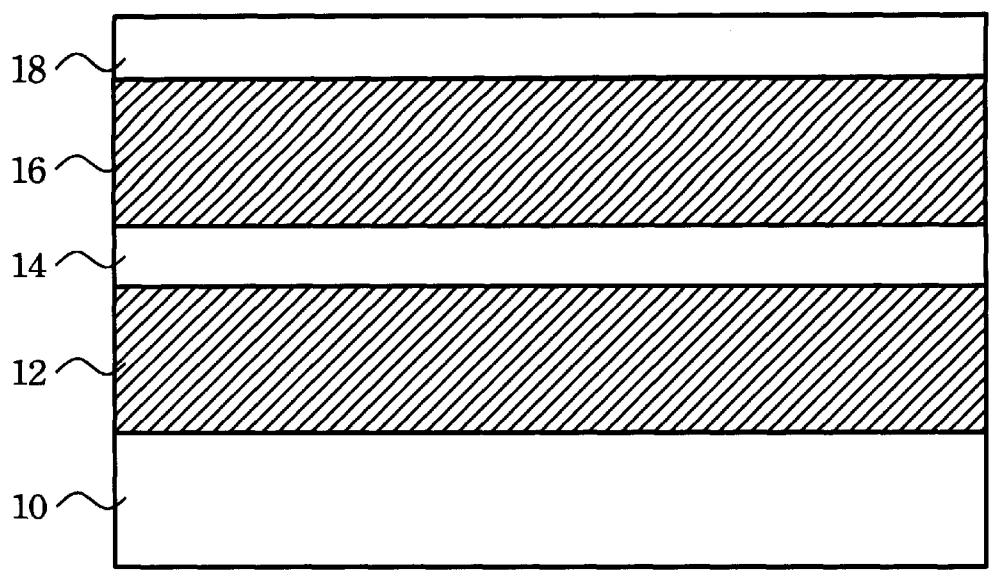
FIG. 1 illustrates a cross sectional view of forming a first oxide layer, a nitride layer, a second oxide layer, and a first silicon layer over a substrate in accordance with the present invention.

Referring to FIG. 1, a semiconductor substrate 10 is provided for forming capacitors over. In general, a substrate 10 with a preferably single crystalline silicon in a <100> direction is provided. For different applications or specifications, a substrate with different crystalline orientations or materials can be used alternatively. As an example, the substrate 10 is provided with transistors formed over in a DRAM fabricating processes. For a clear and focused illustration of the present invention, the transistors are not shown. In following figures, only a focused region of forming a single storage cell is presented and it is well known in the art to form numerous storage cells on a single wafer or substrate by a batch of semiconductor processes.

At first, a first oxide layer 12 is formed over the substrate 10. The first oxide layer 12 is formed preferably with a chemical vapor deposition (CVD) process. A nitride layer 14 is then formed over the oxide layer, also preferably by a chemical vapor deposition process. Followed with the nitride layer 14, a second oxide layer 16 is formed over and a chemical vapor deposition process can be employed in the case. Next, a first silicon layer 18 is formed over the second oxide layer 16. In the preferred embodiment, the first silicon layer can be a polysilicon layer. The polysilicon layer can be formed with well-known deposition processes.

Figure 2:
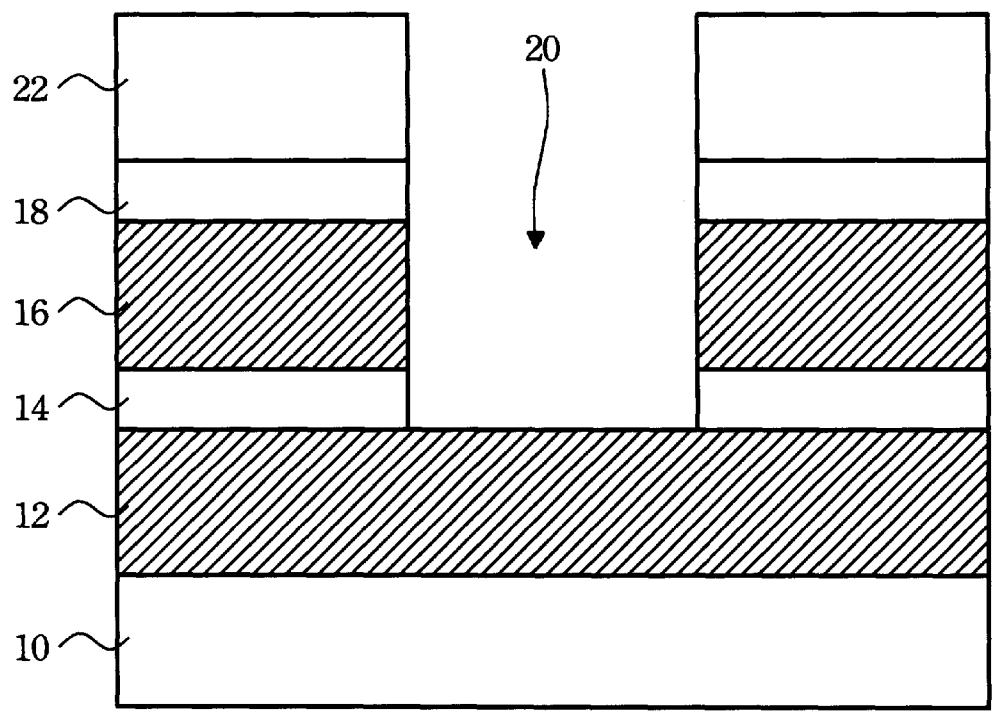
FIG. 2 illustrates a cross sectional view of defining a node opening in the first silicon layer, the second oxide layer, and the nitride layer upon the first oxide layer in accordance with the present invention.

Turning to FIG. 2, a node opening 20 is defined in the first silicon layer 18, the second oxide layer 16, and the nitride layer 14. The node opening 20 is defined right upon the first oxide layer 12 in the case. The node opening 20 can be formed with sequentially a lithography process and etching processes. A photoresist layer 22 can be utilized in the lithography process to define a region of forming the node opening 20, as indicated in the figure. As a preferred embodiment, a region of forming the node opening 20 can be defined in a circular shape and thus the node opening 20 is defined as a cylindrical-shaped opening. The unmasked regions of the first silicon layer 18, the second oxide layer 16, and the nitride layer 14 are then removed with preferably an anisotropic etching process. The process like reactive ion etching (RIE) process can be applied.

Figure 3:
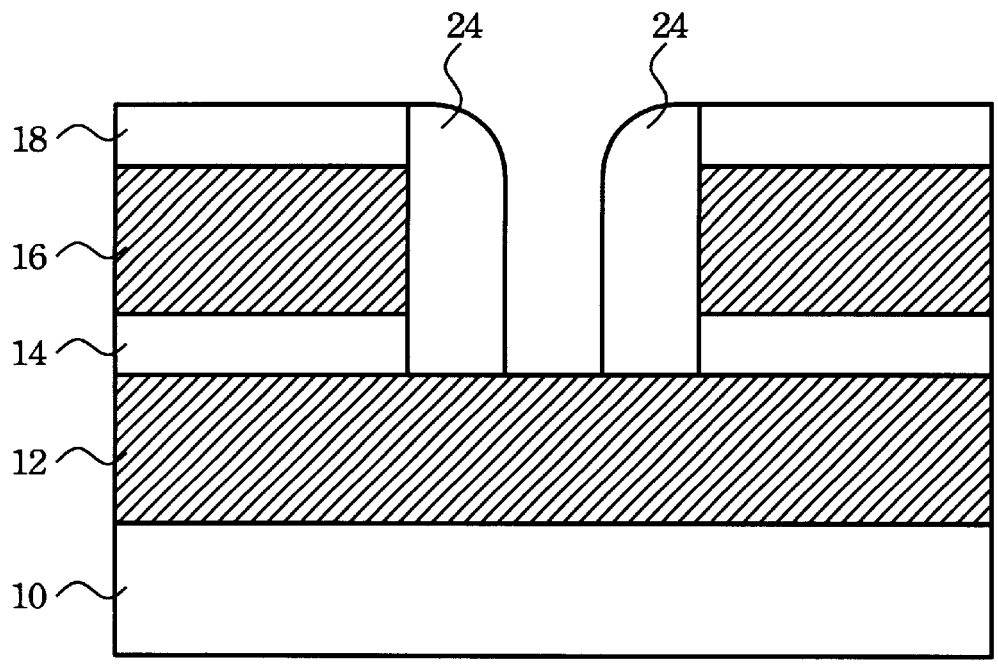
FIG. 3 illustrates a cross sectional view of forming sidewall structures on sidewalls of the node opening in accordance with the present invention.
Figure 4:
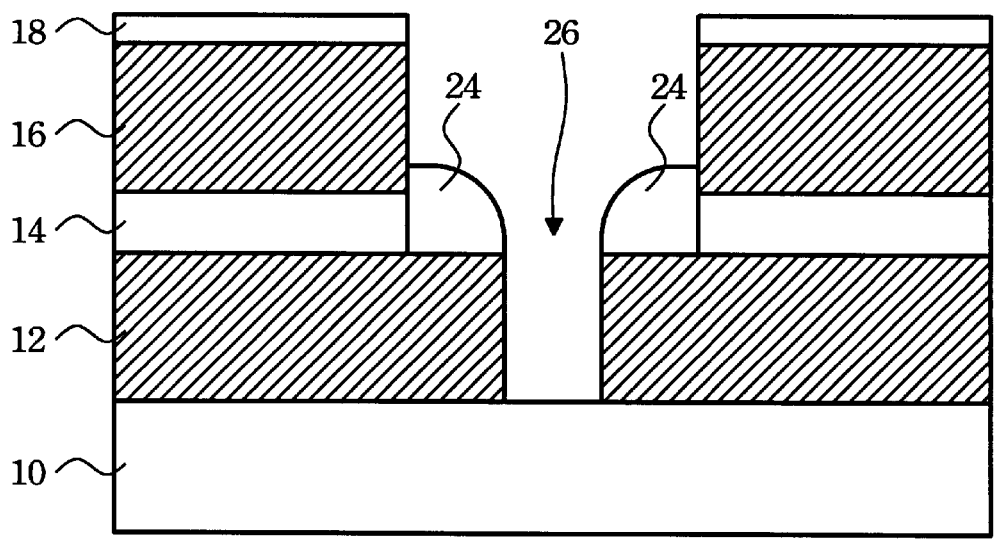
FIG. 4 illustrates a cross sectional view of defining a contact opening in the first oxide layer under the node opening in accordance with the present invention.

Next, sidewall structures 24 are then formed on sidewalls of the node opening 20, as shown in FIG. 3. In the case, nitride sidewall structures are formed as the sidewall structures 24. A nitride depositing and etching-back process can be performed to form nitride spacers. Turning to FIG. 4, a contact opening 26 is defined in the first oxide 12 under the node opening 20. The contact opening 26 is defined under a region uncovered by the sidewall structures 24. With the masking of the sidewall structures 24, a self-aligned patterning process preferably with a dry etching step can be exploited in defining the contact opening 26.

Figure 5:
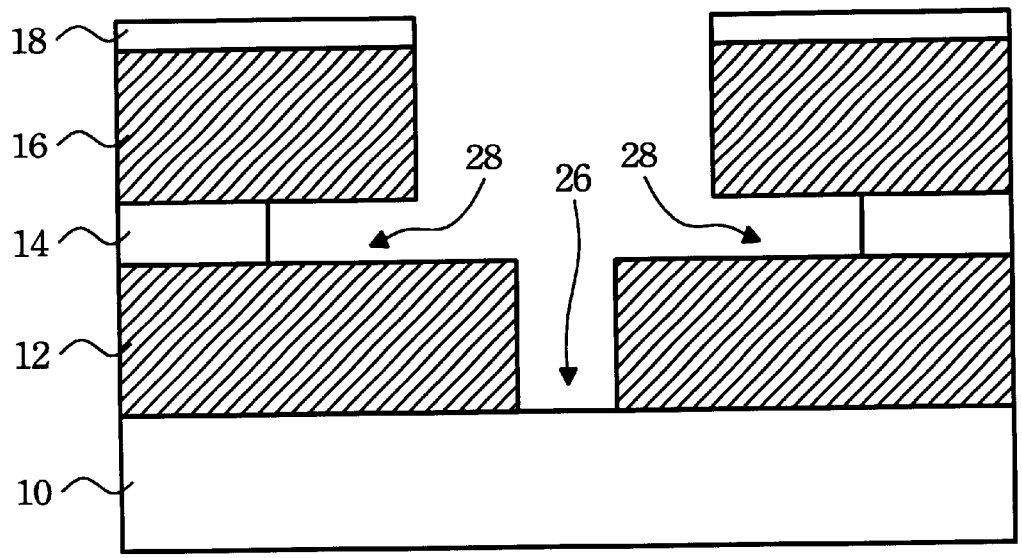
FIG. 5 illustrates a cross sectional view of removing the sidewall structures and a portion of the nitride layer nearby the node opening in accordance with the present invention.
Figure 6:
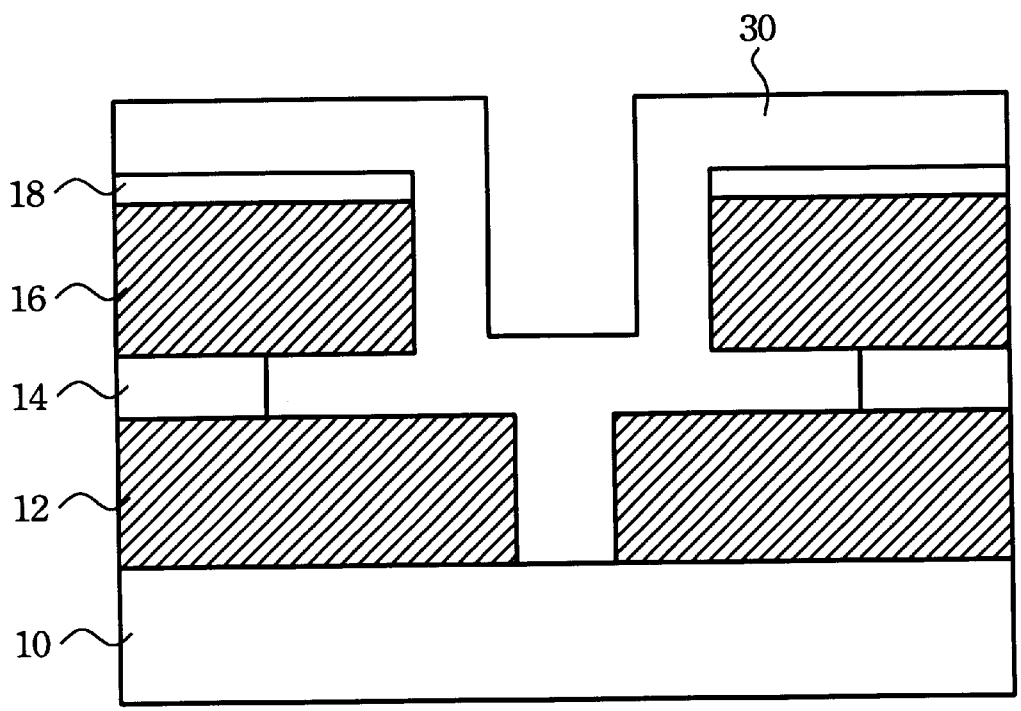
FIG. 6 illustrates a cross sectional view of forming a second silicon layer conformably over the contact opening, the undercut structures, the node opening, and the first silicon layer in accordance with the present invention.

Referring to FIG. 5, after the contact opening 26 is defined, the sidewall structures 24 and a portion of the nitride layer 14 are removed. The portion of the nitride layer 14 which located nearby the node opening are removed to form undercut structures 28 under the second oxide layer 16, as indicated in the figure. An isotropic wet etching step can be applied. With the nitride material of the sidewall structures 24 and the nitride layer 14, an etchant of hot phosphoric acid ($H_3PO_4$) can be used. Turning to FIG. 6, a second silicon layer 30 is formed conformably over the contact opening 20, the undercut structures 28, the node opening 26, and the first silicon layer 18. Being employed as an electrode of the storage cell, the second silicon layer 30 can be a doped polysilicon layer. The doped polysilicon layer can be formed with a deposition process. A in-situ doping process can be utilized to dope n-type or p-type dopants. In the case, n-type dopants are doped for providing a low resistance.

Figure 7:
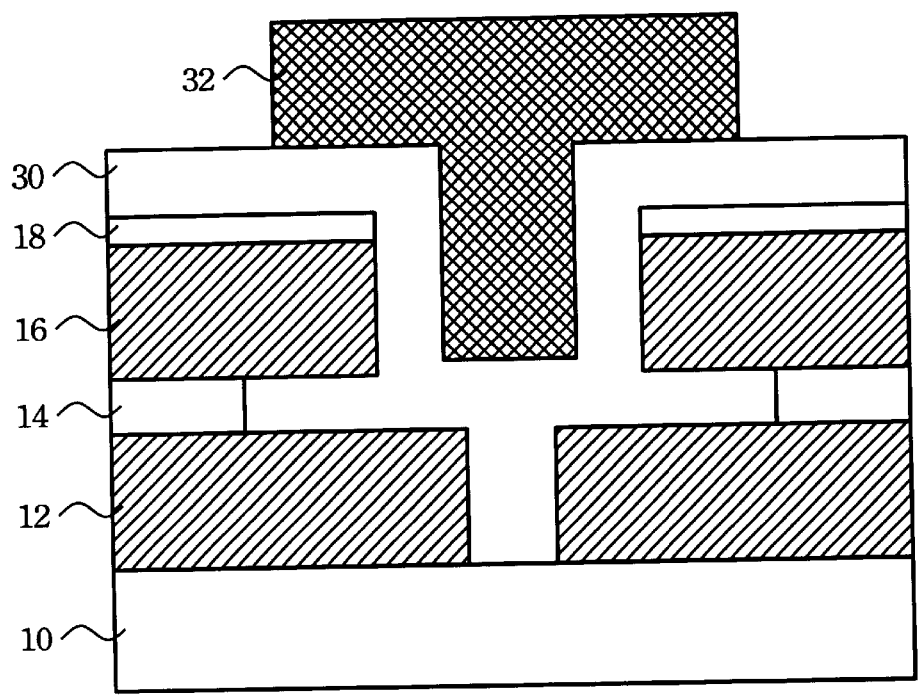
FIG. 7 illustrates a cross sectional view of forming and patterning a node-top defining layer over the second silicon layer in accordance with the present invention.

Next, a node-top defining layer 32 is formed over the second silicon layer 30, as shown in FIG. 7. In the preferred embodiments, the node-top defining layer 32 is a silicon oxide layer for creating the shape of the capacitor at the top portion. Alternatively, other dielectric materials or photoresist can be used as node-top defining layer 32. The node-top defining layer 32 is then patterned to define a node-top defining region by appropriate patterning processes, like the applying of a lithography process and an etch step.

Figure 8:
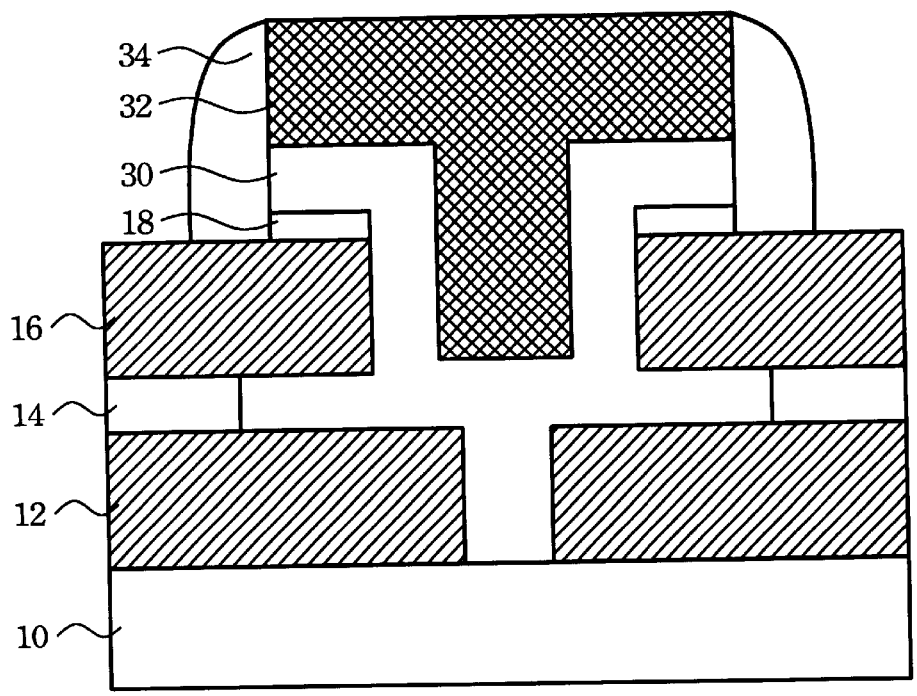
FIG. 8 illustrates a cross sectional view of forming silicon sidewalls on the sidewalls of the node-top defining region in accordance with the present invention.

Turning to FIG. 8, after the node-top defining region 32 is formed, a portion of the second silicon layer 30 and a portion of the first silicon layer 18 uncovered by the node-top defining region 32 are removed. In the case, a isotropic etch process like a reactive ion etch (RIE) can be applied.

Having the shape of the node-top defining region 32, silicon sidewalls 34 are then formed on sidewalls of the node-top defining region 32. Generally, the silicon sidewalls 34 is formed by forming a silicon layer with chemical vapor deposition (CVD) process. A dry etch-back process is then applied to leave the silicon sidewalls spacers on 34 sidewalls of the node-top defining region 32. In the preferred embodiments, the silicon sidewalls 34 are polysilicon spacers. Therefore, the silicon sidewalls 34 can communicate to the first silicon layer 18 and the second silicon layer 32, and the three conductive regions are combined as a bottom electrode 36 of the capacitor, as indicated in FIG. 9.

Figure 9:
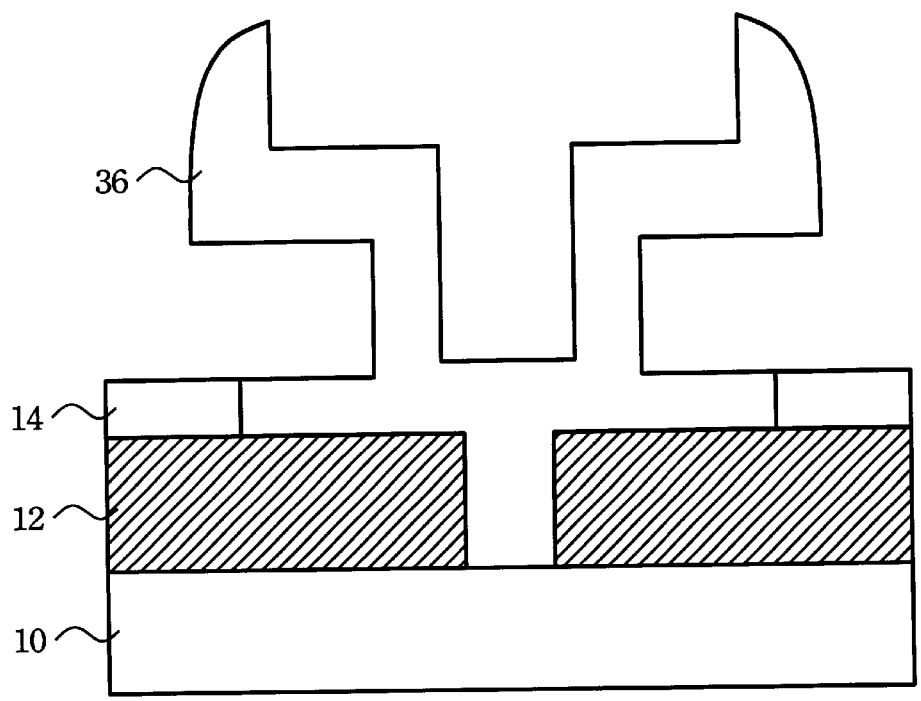
FIG. 9 illustrates a cross sectional view of removing the node-top defining region inside the silicon sidewalls and the second oxide layer in accordance with the present invention.

As shown in FIG. 9, the node-top defining region 32 and the second oxide layer 16 are then removed. In the example of employing silicon oxide as the node-top defining region 32, both of them are removed with a hydrofluoric acid (HF) in a wet etching process. The wet etching is performed using the nitride layer 14 and the second silicon layer 30 as stop layers for masking the underlying structures.

Figure 10:
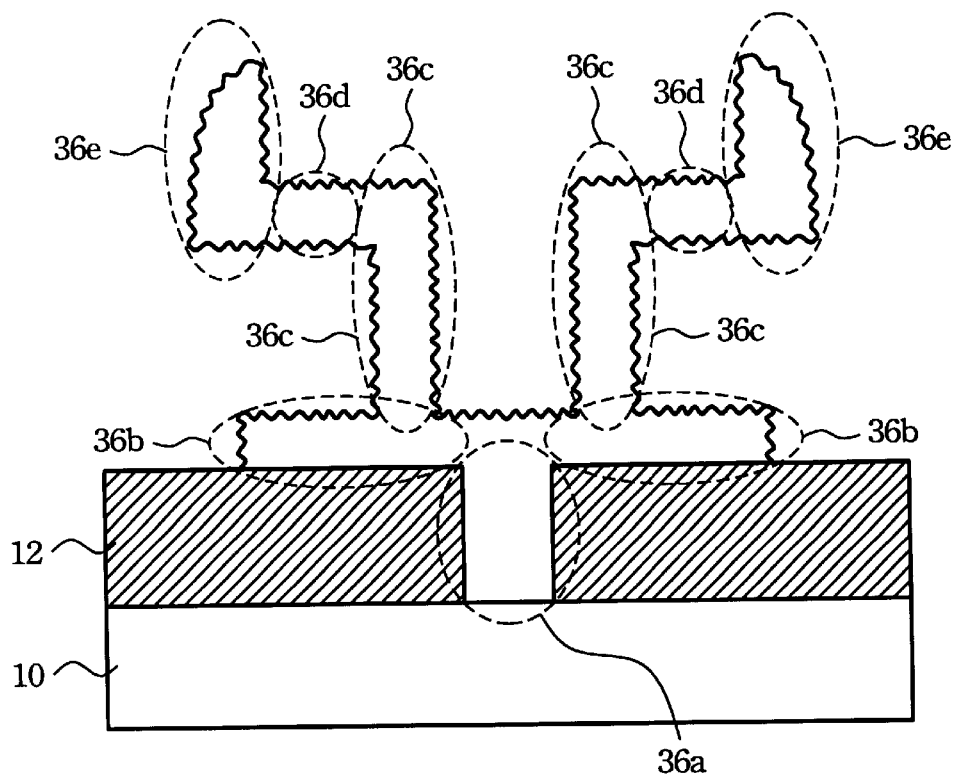
FIG. 10 illustrates a cross sectional view of removing the nitride layer and also preferably roughening the surface of the electrode in accordance with the present invention.

Turning to FIG. 10, another step is performed to remove the nitride layer 14. In the case, a wet etch process is employed and preferably applied to roughen the surface of the electrode 36. In the preferred embodiments, the wet etch is carried out with a hot phosphoric solution to remove remained silicon nitride 14, and also to remove part of the surface portion of the electrode 36 of silicon, in order to roughen the surface of the electrode 36 for having a rugged surface as shown in the figure. In the most preferred embodiment, the composition of the phosphoric acid solution ($H_3PO_4$) is preferably about 86+/−1% $H_3PO_4$ and 14+/−1% $H_2O$. The temperature used in the embodiment is preferably about 150–170° C., and can be ranged between about 140° C. to 180° C. in general.

Therefore, the bottom electrode 36 having a rugged surface of a storage cell is formed as shown in FIG. 10. The bottom electrode 34 in the present invention is composed of the three silicon regions to provide a three-dimensional electrode structure. However, the main structure including the node contact 36a, the horizontal edges 36b, the vertical extensions 36c, and the lateral extensions 36d are mainly composed with the second silicon layer under a single-step deposition.

Therefore, the main structure provides a better strength with reduced number of interfaces between deposited silicon layers. In addition to the improved strength, the vertical portion 34b of the electrode can be well-supported with the lateral extended edge 34c and a better reliability in structure is provided therefrom, as indicated in the figure.

Figure 11:
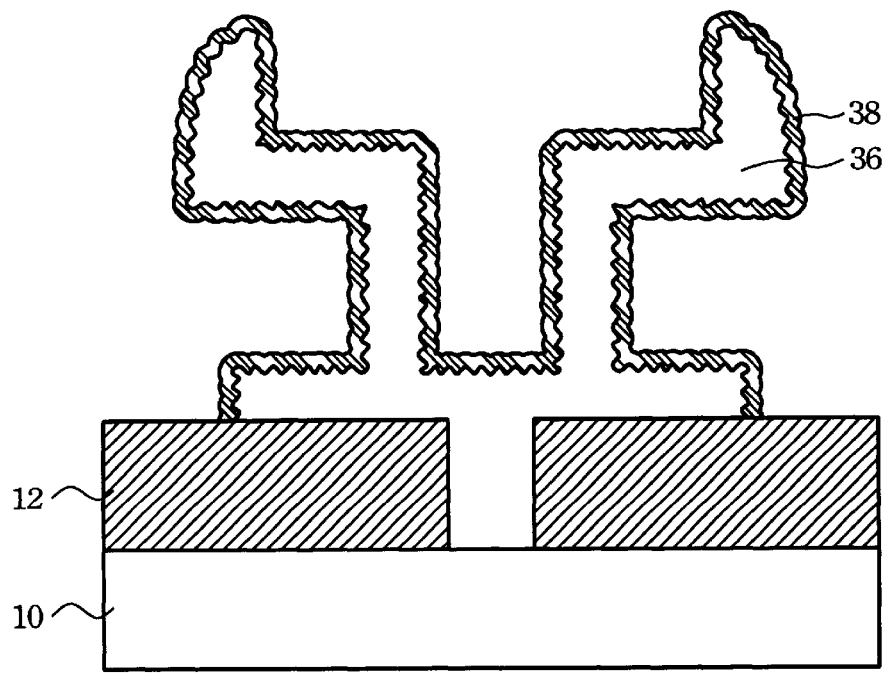
FIG. 11 illustrates a cross sectional view of forming a dielectric film conformably over the electrode of silicon layers in accordance with the present invention.

Referring to FIG. 11, a dielectric film 38 is then formed conformably on the substrate 36, or namely on the rugged bottom electrode 36. In this embodiment, a thin dielectric layer 38, such as stacked oxide-nitride-oxide (ONO) film, is formed on the exposed surface of the bottom electrode 36 and the surface of the first oxide layer 12. As is known in the art of DRAM fabrication, the ONO film is reliable over silicon surfaces, and is typically used as a capacitor insulator. Other material, such as NO (silicon nitride-silicon oxide), $Ta_2O_5$, $TiO_2$, PZT, or BST can be used as the thin dielectric layer 36.

Figure 12:
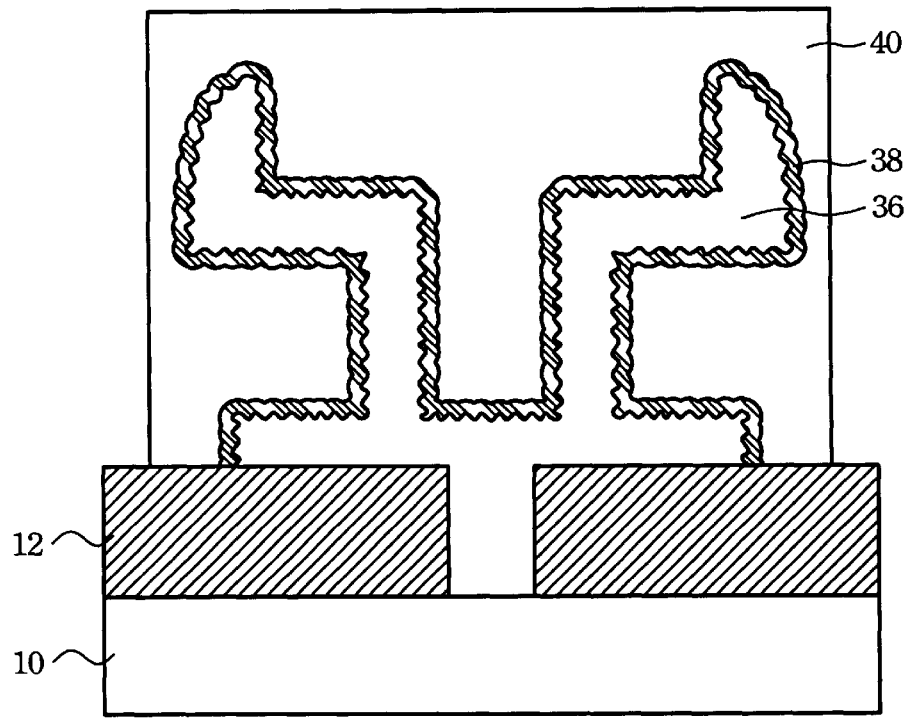
FIG. 12 illustrates a cross sectional view of forming a conductive layer over the dielectric layer in accordance with the present invention.

Finally, a conductive layer 40 is then deposited over the stack silicon oxide/silicon nitride/ silicon oxide layer 38, as shown in FIG. 12, to serve as an upper plate of the DRAM cell capacitor, thereby forming a dynamic random access memory cell with a crown-shaped rugged capacitor. Typically, the conductive layer 40 is a doped polysilicon layer formed in the same manner as the second silicon layer 30. Other material, such as metal or metal silicide, can be used as the conductive layer 40.

Therefore, an extended self-aligned crown-shaped rugged capacitor is formed with the above-described method. The storage capacitance, under the greatly increase surface area of the proposed structure with the rugged surface, can be significantly increased compared with the prior art structures. The crack issue of sidewall polysilicon in the conventional processes can be eliminated with reduced number of interfaces in forming the main structure of the bottom electrode 36 with the self-aligned process.

With the above-described process, a capacitor cell structure of the present invention can be formed. Referring to FIG. 12, the capacitor cell on the substrate 10 has a first electrode 36, a dielectric film 38, and a second electrode 40 of a second conductive material. In the preferred embodiments, the first electrode 36 has a rugged surface on regions uncovered by the underlying dielectric layer 12. The first oxide layer 12 is in fact an underlying dielectric layer between the first electrode 34 and the substrate 10. The dielectric film 38 is formed over the first electrode 36 and the second electrode 40 is formed over the dielectric film 38.

Referring to FIG. 10, the first electrode 36, which is preferably composed of conductive materials like silicon, includes a base contact portion 36a, first laterally extended edges 36b, first vertically extended regions 36c, second laterally extended edges 36d, and second vertically extended regions 36e. The base contact portion 36a is extended down to a junction region of the substrate 10, such as a source or a drain junction. The first laterally extended edges 36b are communicated to the base contact portion to provide electrical couplings essential for the operation of the electrode from the junction region of the substrate 10. The first vertically extended regions 36c are extended from portions of the first laterally extended edges 36b. The second laterally extended edges 36d are extended from top ends of the first vertically extended regions 36c. The second vertically extended regions 36e, which are composed of silicon sidewalls 34, are extended from external ends of the second laterally extended edges 36d.

Having the aforementioned wet etch step to remove the remained nitride layer 14 and surface regions of the bottom electrode 36, most of the first silicon layer 18 underlying the second silicon layer 30 is removed to provide a rugged surface. Therefore, as shown in FIG. 10, the base contact portion 36a, the first laterally extended edges 36b, the first vertically extended regions 36c, and the second laterally extended edges 36d of the first electrode 36 are mainly made of a single silicon layer, namely the second silicon layer 30 as shown in FIG. 7. The second silicon layer 30 in the present invention is preferably deposited with a single chemical vapor deposition process, and thus an improved strength can be provided with a main structure of the electrode 36 having no silicon layer interfaces. Therefore, the prior art crack issue under a composite node with layer-to-layer interfaces can be minimized with the formation of the first electrode 36 only by the second silicon layer 30 and silicon spacer 34 on top.

Therefore, an extended self-aligned crown-shaped rugged capacitor structure is provided and can be formed with the above-described method. The storage capacitance, under the greatly increase surface area of the proposed structure with the rugged surface, can be significantly increased, especially in comparing with the prior art structures. The crack issue of sidewall polysilicon at interfaces in the conventional process can be minimized with reduced number of masks utilized in the self-aligned process.

As is understood by a person skilled in the art, the foregoing descriptions of the preferred embodiment of the present invention are an illustration of the present invention rather than a limitation thereon. It is intended to cover various modifications and similar arrangements included within the spirit and scope of the appended claims. The scope of the claims should be accorded to the broadest interpretation so as to encompass all such modifications and similar structures. While the preferred embodiment of the invention has been illustrated and described, it will be appreciated that various changes can be made therein without departing from the spirit and scope of the invention.

What is claimed is:

1. A capacitor cell on a semiconductor substrate, said capacitor cell comprising:

a first electrode of a first conductive material, said first electrode having a rugged surface on regions uncovered by an underlying dielectric layer, said first electrode comprising:

a base contact portion;

first laterally extended edges communicating to said base contact portion;

first vertically extended regions extending from portions of said first laterally extended edges;

second laterally extended edges extending from top ends of said first vertically extended regions; and second vertically extended regions extending from external ends of said second laterally extended edges;

a dielectric film over said first electrode; and a second electrode of a second conductive material over said dielectric film.

2. The capacitor cell of claim 1, wherein said underlying dielectric layer lies between said first electrode and said substrate.

3. The capacitor cell of claim 1, wherein said first conductive material comprises a doped polysilicon layer.

4. The capacitor cell of claim 1, wherein said base contact portion, said first laterally extended edges, said first vertically extended regions, and said second laterally extended edges of said first electrode are comprised of a single silicon layer which is deposited with a single chemical vapor deposition process.

5. The capacitor cell of claim 1, wherein said base contact portion of said first electrode is extended down to a junction region of said substrate.

6. The capacitor cell of claim 1, wherein said dielectric film is formed conformably over said first electrode.

7. The capacitor cell of claim 1, wherein said dielectric film is selected from the group consisted of stacked oxide-nitride-oxide (ONO) film, NO, $Ta_2O_5$, $TiO_2$, PZT, and BST.

8. The capacitor cell of claim 1, wherein said second conductive material comprises a doped silicon layer.

9. The capacitor cell of claim 1, wherein said second conductive material comprises a metal layer.

10. A capacitor cell on a semiconductor substrate, said capacitor cell comprising:
- a first electrode of a first conductive material, said first electrode having a rugged surface on regions uncovered by an underlying dielectric layer, said first electrode comprising:
  - a base contact portion;
  - first laterally extended edges communicating to said base contact portion;
  - first vertically extended regions extending from portions of said first laterally extended edges;
  - second laterally extended edges extending from top ends of said first vertically extended regions; and
  - second vertically extended regions extending from external ends of said second laterally extended edges,
  - wherein said base contact portion, said first laterally extended edges, said first vertically extended regions, and said second laterally extended edges of said first electrode are comprised of a single silicon layer which is deposited with a single chemical vapor deposition process;
- a dielectric film over said first electrode, said dielectric film being formed conformably over said first electrode; and
- a second electrode of a second conductive material over said dielectric film.

11. The capacitor cell of claim 10, wherein said underlying dielectric layer lies between said first electrode and said substrate.

12. The capacitor cell of claim 10, wherein said first conductive material comprises a doped polysilicon layer.

13. The capacitor cell of claim 10, wherein said base contact portion of said first electrode is extended down to a junction region of said substrate.

14. The capacitor cell of claim 10, wherein said dielectric film is selected from the group consisted of stacked oxide-nitride-oxide (ONO) film, NO, $Ta_2O_5$, $TiO_2$, PZT, and BST.

15. The capacitor cell of claim 10, wherein said second conductive material comprises a doped silicon layer.

16. The capacitor cell of claim 10, wherein said second conductive material comprises a metal layer.

17. An electrode of a capacitor cell on a semiconductor substrate, said first electrode comprising:
- a base contact portion;
- first laterally extended edges communicating to said base contact portion;
- first vertically extended regions extending from portions of said first laterally extended edges;
- second laterally extended edges extending from top ends of said first vertically extended regions; and
- second vertically extended regions extending from external ends of said second laterally extended edges,
- wherein said base contact portion, said first laterally extended edges, said first vertically extended regions, and said second laterally extended edges of said first electrode are comprised of a single silicon layer which is deposited with a single chemical vapor deposition process.

18. The capacitor cell of claim 17, wherein said electrode is composed of a doped polysilicon layer.

19. The capacitor cell of claim 17, wherein said base contact portion is extended down to a junction region of said substrate.

* * * * *